(12) United States Patent
Sugimoto et al.

(10) Patent No.: US 7,084,435 B2
(45) Date of Patent: Aug. 1, 2006

(54) LIGHT EMITTING DEVICE USING LED

(75) Inventors: Masaru Sugimoto, Osaka (JP); Masao Yamaguchi, Kitamoto (JP); Takuma Hashimoto, Yawata (JP); Koji Nishioka, Kadoma (JP); Ryoji Yokotani, Hirakata (JP); Hideyoshi Kimura, Hirakata (JP); Tadashi Murakami, Hirakata (JP); Eiji Shiohama, Katano (JP)

(73) Assignee: Matsushita Electric Works, Ltd., Osaka (JP)

( * ) Notice: Subject to any disclaimer, the term of this patent is extended or adjusted under 35 U.S.C. 154(b) by 0 days.

(21) Appl. No.: 10/483,995

(22) PCT Filed: Jan. 6, 2003

(86) PCT No.: PCT/JP02/07644
§ 371 (c)(1),
(2), (4) Date: Jan. 23, 2004

(87) PCT Pub. No.: WO03/010832
PCT Pub. Date: Feb. 6, 2003

(65) Prior Publication Data
US 2004/0190304 A1 Sep. 30, 2004

(30) Foreign Application Priority Data
Jul. 26, 2001 (JP) ............................. 2001-226699

(51) Int. Cl.
*H01L 29/22* (2006.01)
*H01L 29/24* (2006.01)

(52) U.S. Cl. .................. 257/99; 257/98; 257/100; 313/498; 313/512; 438/22

(58) Field of Classification Search .......... 257/99–100, 257/676, 778; 313/498, 512; 438/22, 46, 438/47, 956
See application file for complete search history.

(56) References Cited

U.S. PATENT DOCUMENTS 6,812,500 B1 * 11/2004 Reeh et al. .................. 257/98
2004/0012958 A1 1/2004 Hashimoto et al.

FOREIGN PATENT DOCUMENTS

| JP | 11261114 | 9/1999 |
| JP | 11298048 | 10/1999 |
| JP | 2000-31531 | 1/2000 |

(Continued)

OTHER PUBLICATIONS

English Language Abstract of JP 2000-315826.
English Language Abstract of JP 2000-31548.
English Language Abstract of JP 2001-148514.
English Language Abstract of JP 2000-349346.

(Continued)

*Primary Examiner*—Donghee Kang
(74) *Attorney, Agent, or Firm*—Greenblum & Bernstein, P.L.C.

(57) ABSTRACT

A light-emitting device which uses and LED having a light-emitting element being placed on a package substrate. The light-emitting element has a light-extracting surface. A fluorescent element which is formed by dispersing a fluorescent material in a transparent substance and is placed face to face with the light-extracting surface of the light emitting element and comprises a clearance gap in between. The light-emitting element generates light of a certain wavelength that emanates through the light-extracting surface into the fluorescent element where the wavelength is changed. The device further comprises an optical element which receives light from the light-emitting element through the fluorescent element and directs the light to the outside of the device.

20 Claims, 11 Drawing Sheets

FOREIGN PATENT DOCUMENTS

| | | | |
|---|---|---|---|
| JP | 2000-031548 | * | 1/2000 |
| JP | 2000-31548 | | 1/2000 |
| JP | 2000-101148 | | 4/2000 |
| JP | 2000-208815 | | 7/2000 |
| JP | 2000-261039 | | 9/2000 |
| JP | 2000-315826 | | 11/2000 |
| JP | 2000-349346 | | 12/2000 |
| JP | 2001-148514 | | 5/2001 |
| WO | 00/33390 | | 6/2000 |

OTHER PUBLICATIONS

English Language Abstract of JP 2000-261039.
English Language Abstract of JP 2000-31531.
English Language Abstract of JP 11-298048.
English Language Abstract of JP 2000-208815.
English Language Abstract of JP 11-261114.
English Language Abstract of JP 2000-101148.

* cited by examiner

LIGHT EMITTING DEVICE USING LED

TECHNICAL FIELD

The present invention relates to a light-emitting device that generates mixed color light by using a light-emitting element and a fluorescent material.

BACKGROUND ART

In recent years, a light-emitting diode (LED) chip that emits blue or ultraviolet light by using a gallium nitride-based compound semiconductor has been developed. Further, by combining the LED chip with various fluorescent materials, light-emitting devices using LED have been developed which can emit light having color hues different from light emitted by the LED chip, such as white light. The light-emitting devices using LED have advantages of small size, little weight and power saving in comparison with light-emitting devices using hot filaments or gas discharges, and have been currently used widely as devices such as light-sources for indication, substitution for small-size light bulbs, and light-sources for liquid crystal display panels. The prior art devices of this type are disclosed in Japanese Laid-open Patent Publication No. 2000-208815, Japanese Laid-open Patent Publication No. 11-261114 and the like. The light-emitting devices using LED shown in these prior art documents have an arrangement in which a fluorescent material or a fluorescent-material-mixed resin is placed around the LED chip, with at least one portion touching the LED chip.

In the above-mentioned light-emitting device using LED, however, since the fluorescent material or the fluorescent-material-mixed resin is made in contact with the LED chip, that is, the light-emitting element, the material or resin tends to quickly deteriorate due to heat from the light-emitting element, and a problem results that the service life of the light-emitting device using LED depends on the service life of the fluorescent material or the fluorescent-material-mixed resin and dose not depend on the service life of the LED chip itself.

Moreover, prior art devices have been proposed (for example, see Japanese Laid-open Patent Publication No. 2000-101148), as shown in FIG. 32 and FIG. 33, in which a light-emitting element 20 connected to wires L and L is sealed by a transparent resin 40 into a shell shape. A fluorescent member 30 in the light-emitting device 100 (FIG. 32) is detachably attached to the outside of the element in contact therewith, and a fluorescent member 30 in the light-emitting device 101 (FIG. 33) is detachably attached thereto with a space 50 placed in a manner so as not to contact the element. However, in these cases, the fluorescent member 30, which has a light scattering property, is placed outside the optical member 40; consequently, even when an attempt is made to converge light rays from the light-emitting element 20 by using the optical member 40, and to align light rays in a predetermined direction, the light rays are scattered by the fluorescent member 30, and problems are caused that desired light-ray alignment is not achieved and it is not possible to efficiently apply light.

The present invention has been devised to solve the above-mentioned problems, and its objective is to provide a light-emitting device having a mixed-color light emitting function, which can lengthen the service life of a fluorescent material or a fluorescent-material-mixed resin that tends to deteriorate quickly, and also can easily form an optical structure that can align light rays outside the device.

DISCLOSURE OF INVENTION

In order to attain the above object, according to the present invention, a light-emitting device which uses an LED, comprises a packaging substrate; a light-emitting element that is placed on the packaging substrate, and has a light-extracting surface from which light is taken out; a fluorescent member which is formed by dispersing a fluorescent material in a transparent substance, where the fluorescent material absorbs light from the light-emitting element, and emits light having a wavelength different from that of the absorbed light, and is placed face to face with the light-extracting surface of the light-emitting element without contacting the light-emitting element; and an optical member which receives incident light from the light-emitting element which has been made incident thereon through the fluorescent member, and aligns the incident light toward the outside of the device.

With this arrangement, light emitted from the light-emitting element, is made incident on the fluorescent member to excite the fluorescent member, and to allow the fluorescent member to re-emit light having a wavelength that is different from that of the incident light (exciting light). This exciting light and light emitted from the fluorescent material are made incident on the optical member to be aligned in a predetermined direction based upon the optical shape of the optical member, and released outside the light-emitting device. Since the fluorescent member is not made in contact with the light-emitting element, the fluorescent member does not suffer from heat of the light-emitting element through heat conduction. Therefore, the heat that the fluorescent member receives from the light-emitting element is smaller than that in the case when the two members are made in contact with each other so that it is possible to suppress deterioration due to heat in the resin or the like that is a transparent substance in which the fluorescent material constituting the fluorescent member or the fluorescent material is dispersed and maintained, and consequently to lengthen the service life of the fluorescent member. Moreover, light from the light-emitting element is first made incident on the fluorescent member having a light-scattering property, and then made incident on the optical member; therefore, in comparison with the case in which, after having been made incident on the optical member, the resulting light is released outside through the fluorescent member, this arrangement allows the optical member to exert a light aligning function more effectively.

Preferably, in the improved invention, the light-emitting element is mounted on the packaging substrate with a face thereof down. Since the light-emitting element is transparent, the light-emitting element can be mounted in such a face-down manner so that its surface without electrode wires is used as a light-extracting surface. For this reason, inclusions such as bonding-use conductive wires that appear in the case of the face-up mounting are not present on the light-extracting surface so that the fluorescent member and the optical member can be placed closer to the light-extracting surface of the light-emitting element as long as they dose not contact the light-emitting element. Therefore, it is possible to control light-aligning operations more effectively in comparison with the case in which the face-up mounting is made. Moreover, since it is possible to avoid for conductive wires or the like screening any portion of emitted light, the light emitted from the light-emitting element, is effectively made incident on the fluorescent member without losses in the light quantity.

Preferably, in the improved invention, the optical member has a convex-lens shape. With this arrangement, light rays, emitted from the fluorescent member, are properly aligned in a predetermined direction in accordance with the shape of a convex lens.

Preferably, in the improved invention, a portion of the optical member that faces the packaging substrate forms a slope surface having a predetermined angle with respect to the light-extracting surface of the light-emitting element, and light rays that have been emitted by the light emitting element and have passed through the fluorescent member and those light rays among light rays that have been emitted by the light-emitting element that are absorbed by the fluorescent member and re-emitted as light having a different wave length, with both types of light rays being made incident of the slope surface, are reflected in the substantially normal direction to the light-extracting surface of the light-emitting element. With this arrangement, among light rays emitted from the fluorescent member, those rays that proceed laterally without going toward the front side of the front surface of the light-extracting surface of the light-emitting element are aligned in a predetermined direction by using the reflection on a slope surface of the optical member.

Preferably, in the improved invention, a surface of the optical member on the light-emitting element side is made into a light reflecting unit having an opening section through which light from the light-emitting element is took in. With this arrangement, among light rays emitted from the fluorescent member, those rays that proceed laterally without going toward the front side of the light-extracting face of the light-emitting element are reflected by the optical reflection unit, and aligned in the forward direction.

Preferably, in the improved invention, the optical member is made of a first optical member having a low refractive index and a second optical member having a high refractive index, and light rays that have been emitting from the light-emitting element and have passed through the fluorescent material and those light rays among light rays that have been emitted from the light-emitting element that are absorbed by the fluorescent member and re-emitted as light having a different wavelength are made incident on the second optical member through the first optical member. With this arrangement, light emitted from the fluorescent member is first made incident on a low-refractive-index member, and then made incident on a high-refractive-index member; therefore, the light can be bent in the forward direction, that is, in a light-converging direction, through a refracting function in the interface between the two optical members.

Preferably, in the improved invention, the optical member is made from an inorganic transparent material. In this arrangement, since the optical member is made from an inorganic transparent material, it becomes possible to suppress deterioration in the optical member due to light.

Preferably, in the improved invention, the light-emitting element is substantially surrounded by the fluorescent member. With this arrangement, the fluorescent member, which substantially surrounds the light-emitting element, can capture light from the light-emitting element more completely so that it is possible to reduce losses due to light leakage, and consequently to provide high efficiency.

Preferably, in the improved invention, the fluorescent member is formed in such a manner that light transmission paths from the light-emitting element in the fluorescent member have substantially the same light path length. With this arrangement, the rate, at which light emitted from the light-emitting element causes excitation to the fluorescent member when it passes through the fluorescent member, is made the same with respect to any light rays emitted from the light-emitting element in any directions. For this reason, the color characteristics of the light rays emitted from the light-emitting device are independent of light-emitting angles and are made substantially uniform; therefore, it is possible to reduce color irregularities in light emitted from the light-emitting device and the subsequent color irregularities on a surface to which the light is applied.

Preferably, in the improved invention, the fluorescent member has a light emitting surface that is formed into a curved surface. With this arrangement, the rate, at which light emitted from the light-emitting element causes excitation to the fluorescent member when it passes through the fluorescent member, is made closer to the same value with respect to any light rays emitted from the light-emitting element in any directions. For this reason, it becomes possible to further reduce color irregularities in comparison with the above-mentioned case.

Preferably, in the improved invention, the fluorescent member has a surface facing the light-emitting element, which is formed into a curved surface. With this arrangement, light emitted from the light-emitting element is made incident on a surface having a curved-surface shape of the fluorescent member on the light-emitting element side; therefore, the reflection on this surface is suppressed, and the light utility efficiency is improved.

Preferably, in the improved invention, the packaging substrate has a concave section, with the light-emitting element being placed on a bottom of the concave section, and a surface of the fluorescent member that faces the light-emitting element is formed to have substantially the same size as an opening shape of the concave section. With this arrangement, the size of the fluorescent member that has a function for converting a wavelength of light emitted from the light-emitting element as well as a function for serving as a pseudo-light source for the optical member can be limited to a minimum size required so that it becomes possible to easily align light rays based upon the optical shape of the optical member.

Preferably, in the improved invention, the concave section has an inner circumferential surface that has a parabolic surface which reflects light directed thereto from the light-emitting element toward the fluorescent member. With this arrangement, the light that is not directly made incident on the fluorescent member from the light-emitting element is reflected by the concave inner circumferential face having a parabolic shape to form substantially parallel light rays, and effectively made incident on the fluorescent member.

Preferably, in the improved invention, the concave section has an inner circumferential surface that has an elliptical surface which reflects light directed thereto from the light-emitting element toward the fluorescent member. With this arrangement, the light that is not directly made incident on the fluorescent member from the light-emitting element is reflected by the concave inner circumferential face having an elliptical shape to be converged in the elliptical focal direction so that the quantity of incident light onto the fluorescent member is made greater in the center portion of the fluorescent member. Therefore, the light emission of the fluorescent member serving as the pseudo-light source for the optical member is allowed to have high luminance in the center portion of the fluorescent member, and consequently to form a point light source; thus, it becomes possible to easily align light rays by using the optical member efficiently.

Preferably, in the improved invention, the fluorescent member is fitted to the opening section of the concave section. With this arrangement, only the fluorescent member that tends to deteriorate earlier in comparison with other parts can be exchanged so that it becomes possible to further lengthen the service life of the light-emitting device.

Preferably, in the improved invention, the packaging substrate is made from a heat conductive material. With this arrangement, it is possible to improve the heat radiating property of the light-emitting element, and consequently to further lengthen the service life of the light-emitting element. Thus, the light-emitting element in which power input has been limited due to temperature control is allowed to efficiently radiate heat so that the power input to the light-emitting element is increased, making it possible to increase the quantity of light emission.

Preferably, in the improved invention, the light-emitting element is sealed by a light-transmitting resin, with a light-emitting surface of the transparent resin formed into a curved surface. With this arrangement, since the light-emitting element can be sealed by a light-transmitting resin that has a refractive index that is greater than air and smaller than the light-emitting element, it becomes possible to efficiently extract light from the light-emitting element. Moreover, since the surface of the sealing resin is formed into a curved face, the light component that reflects from the interface between the sealing resin and the air layer is reduced, thereby making it possible to further increase the light-extracting efficiency, and consequently to increase the efficiency of the light-emitting element.

Preferably, in the improved invention, a reflection preventive film, which suppresses light reflection on the fluorescent member surface with respect to light from the light-emitting element, and increases the quantity of incident light into the fluorescent member, is interpolated between the fluorescent member and the light-emitting element. With this arrangement, among light rays that proceed from the light-emitting element toward the fluorescent member, those light rays that have been reflected by the surface of the fluorescent member are made incident on the fluorescent member; thus, it becomes possible to improve the efficiency of the light-emitting device.

Preferably, in the improved invention, a light-scatting material, which scatters light rays that have been emitted from the light-emitting element and have passed through the fluorescent member or those light rays among the light rays emitted from the light-emitting element that are absorbed by the fluorescent member and re-emitted as light having a different wavelength, is interpolated between the fluorescent member and the optical member. With this arrangement, light released from the fluorescent member is scattered by the light-scattering member so that the distribution of light intensity is averaged. For this reason, color characteristics of light emitted from the light-emitting device are alleviated so as not to be dependent on the radiation angle of light; thus, it is possible to prevent color irregularities of light emitted from the light-emitting device and resulting color irregularities on the surface irradiated with this light.

Preferably, in the improved invention, the fluorescent member is placed inside the concave section formed in the optical member. With this arrangement, the optical member can be placed closer to the substrate and the light-emitting element so that it is possible to easily design the optical shape of the optical member. Moreover, a concave section is formed in the optical member, and the entire surface with this concave section formed therein is coated with a fluorescent member, and an excessive amount of the fluorescent member is wiped with, for example, squeegee or the like; thus, with these manufacturing processes, the fluorescent member is uniformly formed in the concave section. Consequently, it is possible to get light-emitting devices among which color irregularities are alleviated, and it is also possible to simplify the manufacturing processes as compared with the conventional method; thus, it becomes possible to improve the manufacturing cost reduction effects. In particular, this arrangement is effective when applied to a light-emitting device having a plurality of light-emitting elements integrally formed therein.

BEST MODE FOR CARRYING OUT THE INVENTION

Referring to Figures, the following description discusses embodiments of the present invention. In the following embodiments, a light-emitting diode (LED) made of a gallium nitride-based compound semiconductor that emits blue light, and is formed on a transparent sapphire substrate is used as a light-emitting element, unless otherwise indicated. This light-emitting element is mounted on a packaging substrate in a face-down state (flip-chip mounting) in which the face on which a p-side electrode and an n-side electrode are formed is aligned face to face with the packaging substrate with the sapphire substrate being placed on the side opposite to the packaging substrate. A fluorescent material forming a fluorescent member is prepared as a yttrium-aluminum-garnet (YAG) based fluorescent material activated by cerium, which is excited by blue light to emit yellow light. With respect to the material of an optical member, an acrylic resin is used, unless otherwise indicated, and this member is molded through an injection molding method. Here, the kinds of the light-emitting element and colors of emitted lights are not limited to those of the present embodiments. The kind of the fluorescent material is not particularly limited to the YAG based fluorescent material, and any material may be used as long as it is excited by light from the light-emitting element and can emit light of which a wavelength is different from that of the light from the light-emitting element. The material and the molding method of the optical member are not particularly limited to those of the present embodiments. Moreover, the direction (light-aligning direction or forward direction) in which the light-emitting device aligns light rays in the external region is generally set in a normal direction to a light-extracting surface of the light-emitting element, which proceeds to outside of the light-emitting element, and corresponds to the center axis direction of the optical shape of the optical member (such as a lens) and the fluorescent member. Here, each of the fluorescent member and the optical member has a surface on the light incident side and a surface on the light emitting side, and in general, in each of the members placed inside the device, the surface that faces the light-extracting surface of the light-emitting element forms the surface on the light incident side and the opposite surface forms the surface on the light-releasing side of the member. Moreover, in the following description, with respect to the same structure in the respective embodiments, explanations thereof are omitted.

EMBODIMENT 1

Figure 1:
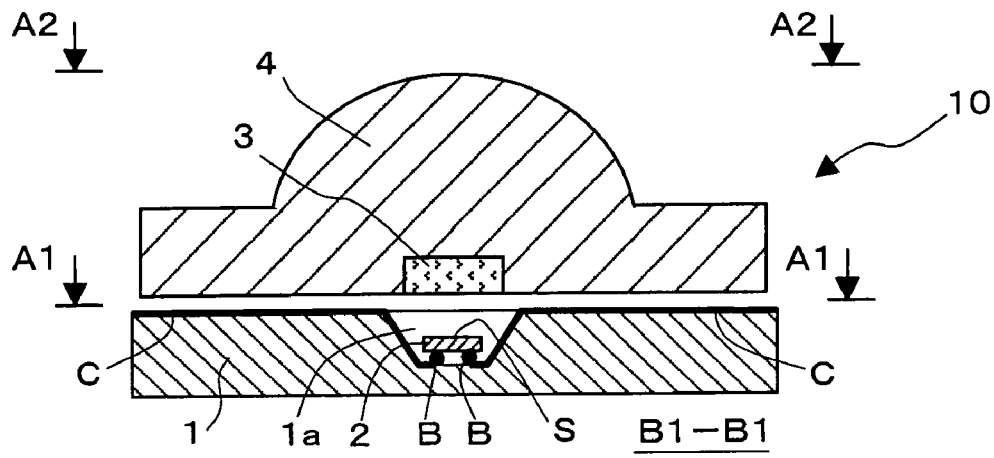
FIG. 1 is a cross-sectional view that shows a light-emitting device in accordance with embodiment 1 of the present invention, and corresponds to a cross-sectional view taken along line B1—B1 in FIGS. 2 and 3.
Figure 2:
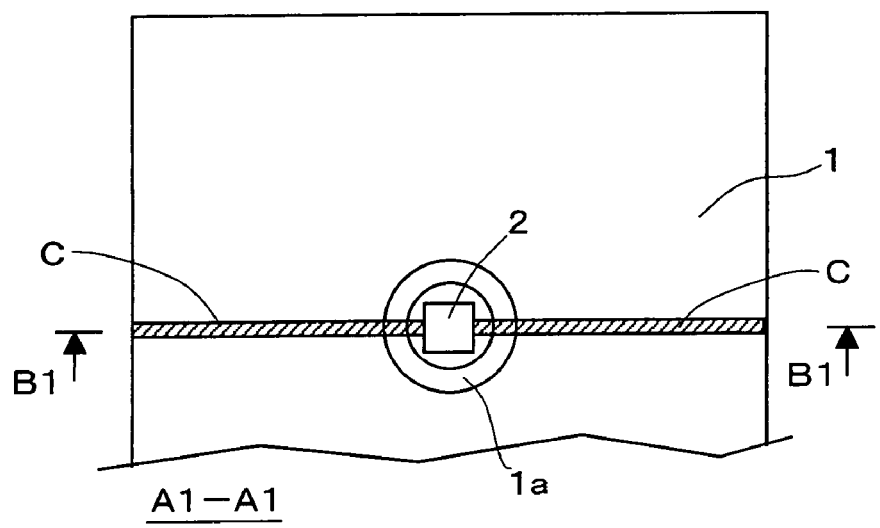
FIG. 2 is a plan view taken along line A1—A1 in FIG. 1.
Figure 3:
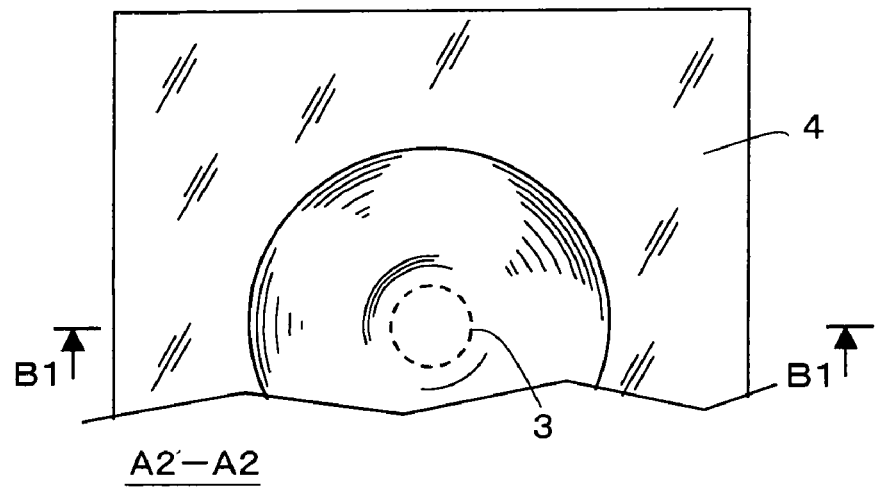
FIG. 3 is a plan view taken along line A2—A2 in FIG. 1.

Referring to FIGS. 1 through 3, the following description discusses embodiment 1 of the present invention. The light-emitting device 10 of the present embodiment is provided with a light-emitting element 2 which is placed on a bottom surface of a concave section 1a that has a reversed cone shape with a trapezoidal shape in its cross-section and is formed on one surface of a flat-plate-shaped packaging substrate 1, an optical member 4 having a flat surface that is aligned face to face with the surface of the packaging substrate 1 on which this light-emitting element 2 is placed, and a disc-shaped fluorescent member 3 that is embedded in a concave section formed in the center portion of the surface belonging with the optical member 4 and facing the packaging substrate 1 so as to be flush with the above-mentioned surface of the optical member 4. The light-emitting element 2 is a blue-light-emitting LED, and is mounted with its face down, and the electrode patterns of the light-emitting element 2 are connected to wiring patterns C and C formed on the substrate through electrically-connecting-use bumps B and B made of gold or the like. The fluorescent member 3 is placed on the optical member 4 formed by molded resin, on the side closest to the light-emitting element in a manner so as not to contact the light-emitting element 2. The size of the fluorescent member 3 is set to substantially the same size as the opening shape of a concave section 1a formed in the packaging substrate 1. The wiring patterns C and C are, as shown in FIG. 2, formed on the surface of the packaging substrate 1 in the form of strips, extended to reach the lower surface of the light-emitting element 2 through the slope surface of the concave section 1a, and bump-bonded to the light-emitting element 2. Moreover, as shown in FIG. 3, the optical member 4, which is made of a transparent acrylic resin, has a convex portion of an axisymmetric shape in the center thereof. The convex portion exerts a light-converging function and the like on the light rays from the fluorescent member 3 so as to align and project the light rays toward the outside of the light-emitting device.

Moreover, in FIG. 1, the packaging substrate 1 and the optical member 4 are placed with a space located in between, and for this structure, a supporting member to support the two members is required; however, the supporting member is not shown in this Figure. An arrangement without this space is also applicable.

In the light-emitting device 10 having the arrangement described above, power is supplied to the light-emitting element 2 through the wiring patterns C and C, thereby allowing the light-emitting element 2 to emit blue light. The blue light from the light-emitting element 2 is emitted from a light-extracting surface S that is the surface of the light-emitting element 2 on the opposite side to the sapphire substrate side, and made incident on the fluorescent member 3 that faces this surface S; thus, one portion of the light is converted to yellow light, and this light is made incident on the optical member 4 together with the original blue light that has not been converted. Further, these light rays are refracted by the optical shape of the optical member 4, that is, by the surface of the convex portion having the axisymmetric shape, and aligned toward the outside of the light-emitting device 10. In the light rays thus aligned, blue light from the blue LED and yellow light converted from the blue light are mixed with each other to form, for example, white light, depending on the rate of the mixed colors.

The fluorescent member 3 is formed by dispersing a YAG fluorescent material in a silicone resin that is a transparent substance. With respect to this silicone resin, a silicone resin having substantially the same refractive index as the acrylic resin used as the optical member 4 is used. The kind of the resin to be used as the fluorescent member 3 is not particularly limited by the present embodiment; however, from the viewpoint of a light-aligning property, the same material as the optical member 4 or a material having a refractive index close to that of the optical member 4 is preferably used. Moreover, the present embodiment has an arrangement in which a silicone resin that is molded with YAG fluorescent material particles being dispersed therein is used as the fluorescent member 3, and this is placed in a concave section formed in the light-emitting element side of the optical member 4; however, the concept of the fluorescent member 3 formed by dispersing the fluorescent material in the transparent substance includes a structure in which only the fluorescent material is loaded in the above-mentioned concave section and this is covered with a light-transmitting resin molded into a thin plate as a lid, and the loading structure of this type may be used as the fluorescent member 3.

With this structure, light emitted from the light-emitting element 2 is made incident on the fluorescent member 3 to excite the fluorescent material so that the fluorescent material emits light having a wavelength that is different from that of the incident light (exciting light). This exciting light and the light emitted from the fluorescent material are made incident on the optical member 4, and aligned in a predetermined direction in accordance with the optical shape of the optical member 4 to be projected outside the light-emitting device 10. Since the fluorescent member 3 is not made in contact with the light-emitting element 2 so that it does not receive the heat from the light-emitting element 2 through heat conduction. Consequently, since the heat received by the fluorescent member 3 from the light-emitting element 3 becomes smaller than that in the case in which the two members are in contact with each other, it becomes possible to suppress deterioration due to heat in the fluorescent material forming the fluorescent member 3 or the resin or the like that is a transparent substance in which the fluorescent material is dispersed and held, and consequently to lengthen the service life of the fluorescent member 3. Moreover, since light from the light-emitting element 2 is first made incident on the fluorescent member 3 having a light-scattering property, and then made incident on the optical member 4, it is possible to make the light-aligning function of the optical member 4 more effective in comparison with the case in which the light is made incident on the optical member 4 and then released outside through the fluorescent member 3.

Moreover, since the light-emitting element 2 is transparent and the light-emitting element 2 is mounted with its face down, the surface having no electrode patterns can be used as the light-extracting surface S. For this reason, obstacles such as bonding wires that tend to appear in the case of a face-up mounting are not present on the light-extracting surface S, so it becomes possible to place the fluorescent material 3 and the optical member 4 closer to the light-extracting surface S of the light-emitting element 2 as long as they dose not contact the light-emitting element 2. Therefore, it is possible to obtain a more effective light-aligning operation in comparison with the face-up mounting case. Moreover, since no conductive wires or the like screen any portion of the emitted light, the light emitted from the light-emitting element 2 is effectively made incident on the fluorescent member 3 without losses in light quantity.

Moreover, since the size of the fluorescent member 3 is substantially the same size of the opening shape of the concave section 1a formed in the packaging substrate 1, the size of the fluorescent member 3 that has a function for converting a wavelength of light emitted from the light-emitting element 2 as well as a function for serving as a pseudo-light source for the optical member 4 can be limited to a minimum size required. Furthermore, since the light source is regarded as a pseudo point light source with respect to the optical member 4, it is possible to easily align light rays based upon the optical shape of the optical member 4.

EMBODIMENT 2

Figure 4:
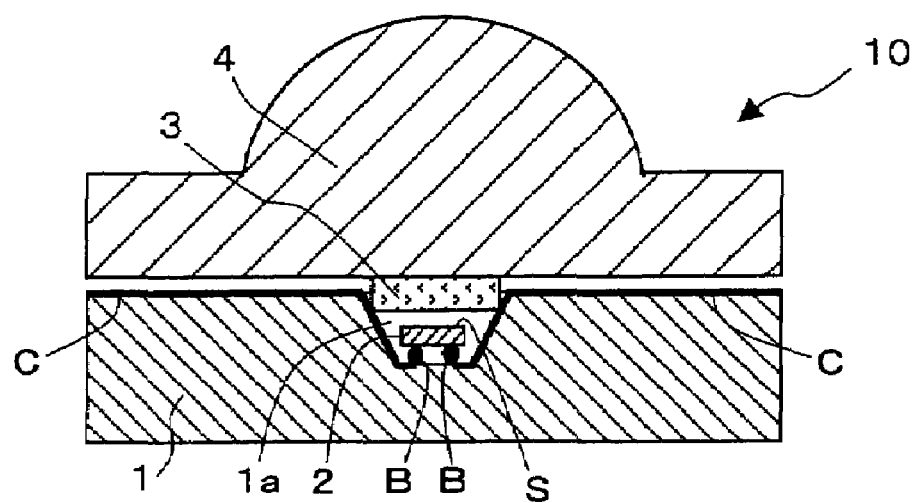
FIG. 4 is a cross-sectional view that shows a light-emitting device in accordance with embodiment 2.
Figure 5:
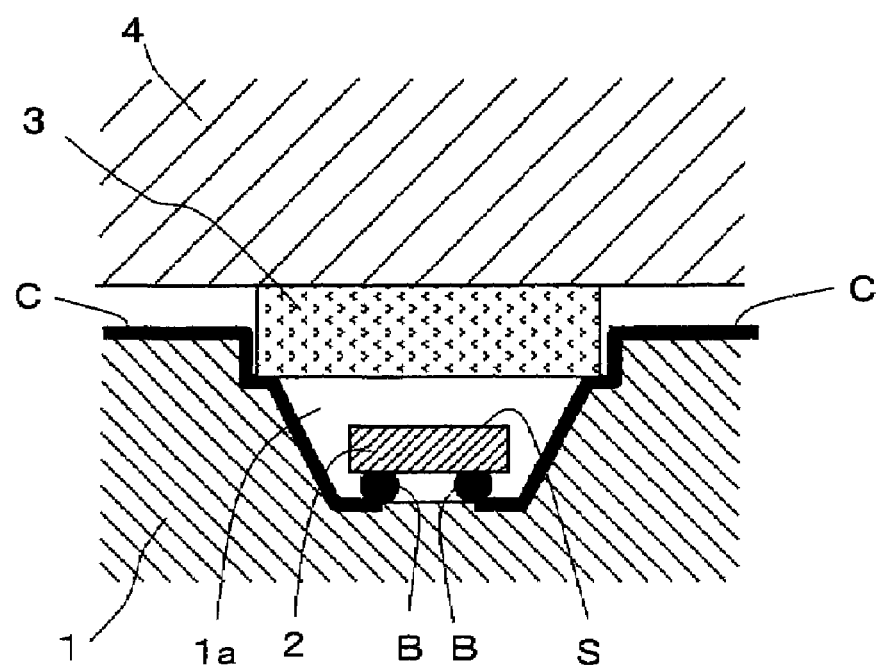
FIG. 5 is an enlarged cross-sectional view that shows an essential portion of FIG. 4.

Referring to FIG. 4 and FIG. 5, the following description discusses embodiment 2 of the present invention. A step portion is formed on the upper portion of the opening of the concave section 1a in the packaging substrate, which is formed as a section in which the light-emitting element 2 is placed, and the fluorescent member 3 is fitted and detachably attached to this step portion. With this arrangement, only the fluorescent member that tends to deteriorate faster in comparison with other parts can be exchanged so that it becomes possible to further lengthen the service life of the light-emitting device.

EMBODIMENT 3

Figure 6:
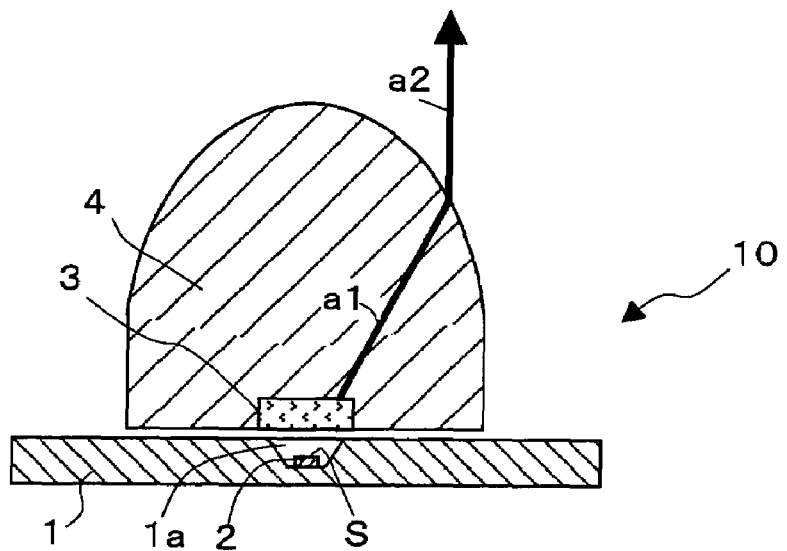
FIG. 6 is a cross-sectional view that shows a light-emitting device in accordance with embodiment 3.
Figure 7:
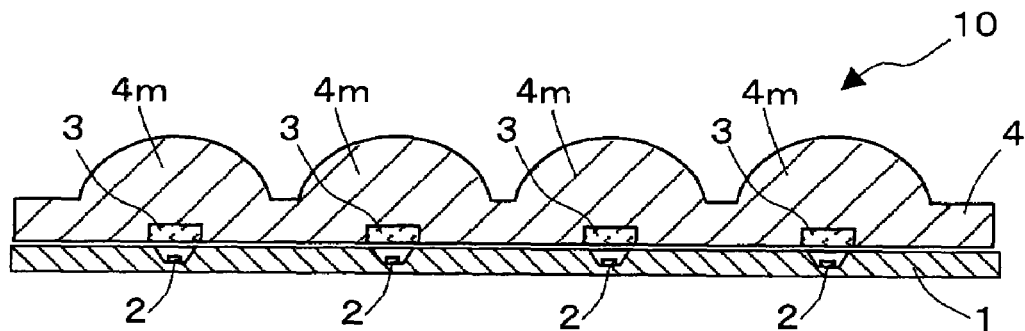
FIG. 7 is a cross-sectional view that shows a light-emitting device in accordance with embodiment 3.

Referring to FIG. 6 and FIG. 7, the following description discusses embodiment 3 of the present invention. In the light-emitting device of the present embodiment, as shown in FIG. 6, the optical member 4 has a convex lens shape formed into a shell shape. With this optical shape, light a1, emitted from the fluorescent member 3, is formed into light a2 that is refracted so as to be converged in the center direction of the light-emitting device 10, and aligned on the surface of the optical part 4.

Moreover, as shown in FIG. 7, in a light-emitting device 10 in which a plurality of light-emitting elements 2 are assembled on the packaging substrate with multi-lenses 4m that form respective convex lenses being placed as the optical members 4 with respect to the light-emitting elements 2, by using a plurality of the light-emitting elements 2, the device is capable of applying a more quantity of light outside the device. The optical member 4 having such a structure with multiple lenses is advantageous in that it is easily manufactured through an integrally molding process.

EMBODIMENT 4

Figure 8:
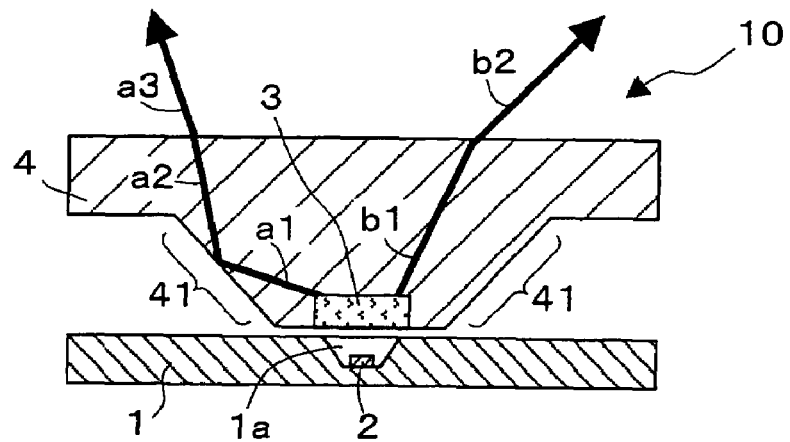
FIG. 8 is a cross-sectional view that shows a light-emitting device in accordance with embodiment 4.
Figure 9:
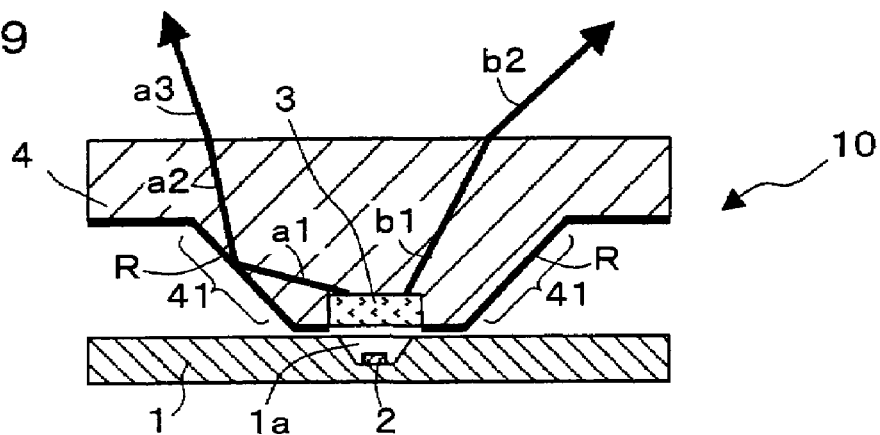
FIG. 9 is a cross-sectional view that shows a light-emitting device in accordance with embodiment 5.

Referring to FIG. 8, the following description discusses embodiment 4 of the present invention. The optical shape of the optical member 4 is designed in such a manner that the surface extracting light toward the outside of the light-emitting device 10 is formed into a flat face, and the surface that is directed to the light-emitting element 2 is formed into a convex shape with a slanting portion 41. Moreover, the fluorescent member 3 is placed at the tip of the convex shape that is the side of the optical member 4 closest to the light-emitting element.

With this arrangement, among light rays from the fluorescent member 3, a light ray a1, which proceeds laterally in a manner different from light rays b1 and b2 proceeding in a predetermined light-aligning direction of the optical member, is made incident on the slanting portion 41 of the optical member 4, and reflected therefrom to form a reflected light a2 that is aligned in a predetermined direction.

EMBODIMENT 5

Referring to FIGS. 9 to 12, the following description discusses embodiment 5 of the present invention. These light-emitting devices 10 are provided with a reflecting portion R on a face of the optical member 4 on the side facing the packaging substrate 1; thus, the light-aligning property is improved, and light from the light-emitting element 2 is effectively utilized. First, the device 10 shown in FIG. 9 has the same arrangement as the light-emitting device 10 of FIG. 8 except that, on a surface of the optical member 4 that faces the packaging substrate 1 but the portion where the fluorescent member is placed, the reflecting portion R having a high reflectance is formed by aluminum vapor deposition. With this arrangement, different from the case of embodiment 4, most of a light ray a1 that is made incident on the slanting portion 41 of the optical member 4 is reflected by this light reflecting portion R to form a reflected light a2 without passing through the slanting portion 41, and aligned in the forward direction without losses.

Figure 10:
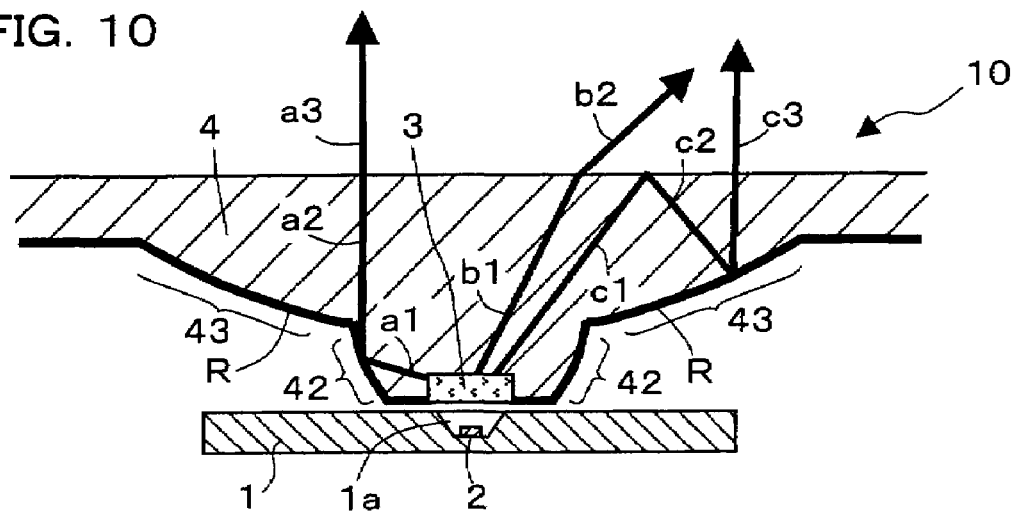
FIG. 10 is a cross-sectional view that shows a light-emitting device in accordance with embodiment 5.

Moreover, in a device shown in FIG. 10, the optical member 4 has an optical shape of a flat face formed on the light-releasing side, and of two steps of convex-shape faces 42 and 43 formed on the side facing the packaging substrate 1. In the same manner as described above, on a surface of the optical member 4 that faces the packaging substrate 1 but the portion where the fluorescent member 3 is placed, the reflecting portion R having a high reflectance is formed by aluminum vapor deposition. With this arrangement, among light rays released from the fluorescent member 3, most of a light ray a1 that proceeds laterally is reflected by this light reflecting portion R in the convex-shape face 42 to form a reflected light ray a2. Moreover, most of a light ray c2, originally a light ray c1 that proceeds toward a flat face on the light-emitting side of the optical member 4 and is reflected and returned by the flat face, is reflected by the reflecting portion R in the convex-shape face 43 to form a reflected light ray c3. Consequently, those light rays that do not proceed toward a light-aligning direction in the optical member 4 can be reflected by the reflecting portion R, and aligned in a predetermined direction.

Figure 11:
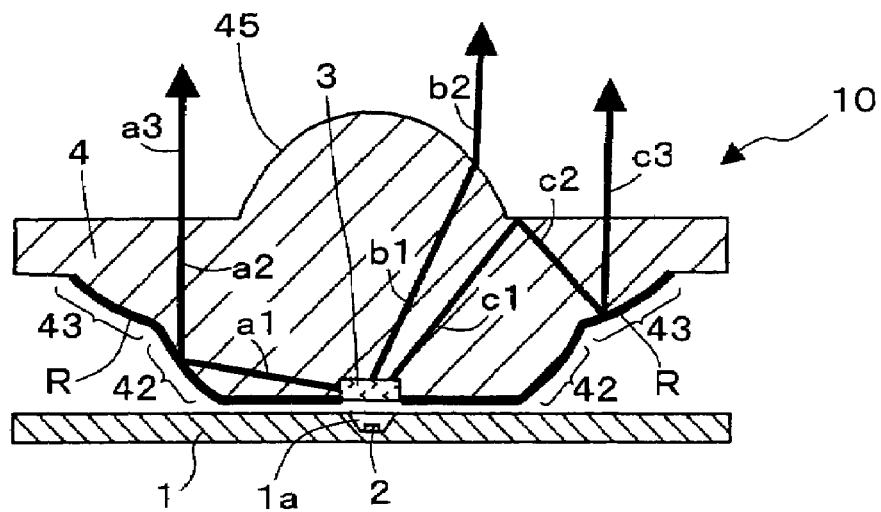
FIG. 11 is a cross-sectional view that shows a light-emitting device in accordance with embodiment 5.

Furthermore, a device shown in FIG. 11 has an arrangement in which the surface of the optical member 4 of FIG. 10 on the light-emitting side is formed into a convex-lens shape 45. With this arrangement, among light rays emitted from the fluorescent member 3, those light rays, such as a light ray b1, that pass through the convex-lens shape 45 are refracted by the lens boundary in the light-aligning direction so that it becomes possible to further improve the light-aligning property in comparison with the above-mentioned arrangement. In this manner, this light-emitting device 10 makes it possible to emit almost all the light rays emitted from the fluorescent member 3 in the light-aligning direction.

Figure 12:
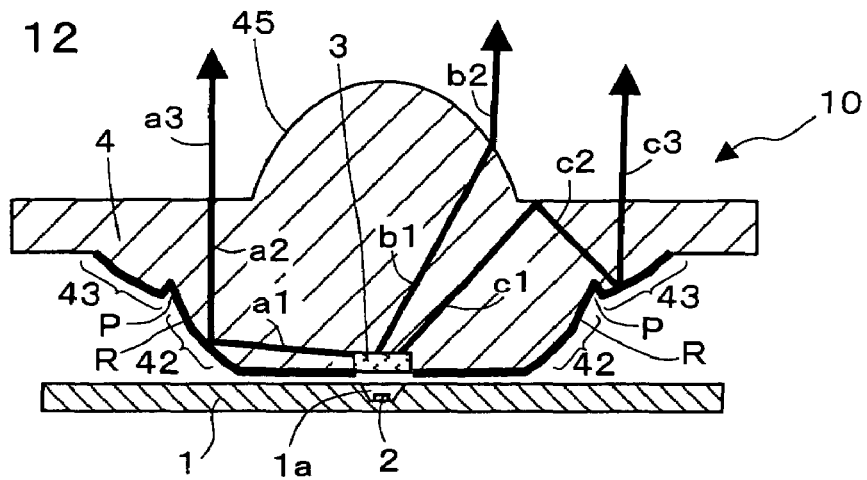
FIG. 12 is a cross-sectional view that shows a light-emitting device in accordance with embodiment 5.

Moreover, in a device shown in FIG. 12, a notch shape is formed in a point of inflection P of two steps of convex surfaces 42 and 43 placed on the side of the optical member 4 of FIG. 11 facing the packaging substrate 1, and the convex surface 42 is extended toward the convex surface 43 side so as to be inserted therein. With this arrangement, it is possible to obtain an optical member shape having the best light utility efficiency, which emits almost all the light rays emitted from the fluorescent member 3 in the light-aligning direction.

EMBODIMENT 6

Figure 13:
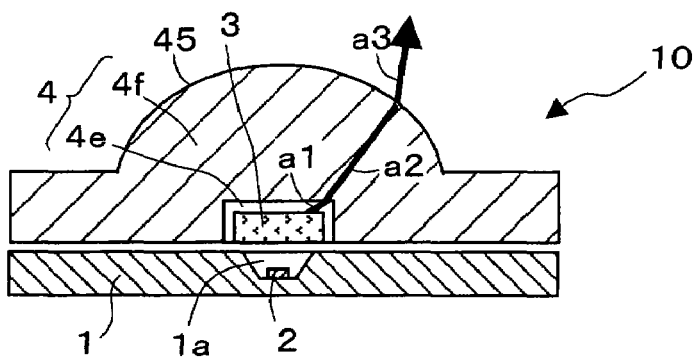
FIG. 13 is a cross-sectional view that shows a light-emitting device in accordance with embodiment 6.

Referring to FIG. 13, the following description discusses embodiment 6 of the present invention. The optical member 4 is constituted by a first optical member 4e having a low refractive index and a second optical member 4f having a high refractive index. Here, with respect to the first optical member 4e having a low refractive index, for example, silica aerogel can be used, and with respect to the second optical member 4f having a high refractive index, the above-mentioned acrylic resin can be used. Then, a light ray a1 from the fluorescent member 3 passing through the first optical member 4e is first refracted by the boundary, and made incident on the second optical member 4f (light ray a2), and next refracted by the surface 45 of the optical shape of the optical member 4, and aligned toward the outside of the device (light ray a3). In this manner, light emitted from the fluorescent member 3, is made incident on the high-refractive-index medium after having been made incident on the low-refactive-index medium; therefore, the light is bent toward a converging direction in the forward direction through refractive functions on the boundary of the two optical members. With this arrangement, since the light emitted from the fluorescent member is made incident on the high-refractive-index member after having been made incident on the low-refractive-index member, it is possible to bend the light toward a converging direction in the forward direction through refractive functions on the boundary of the two optical members.

EMBODIMENT 7

The light-emitting device of embodiment 7 of the present invention, which relates to any of the above-mentioned light-emitting devices, has an arrangement in which the optical member 4 is made of molded transparent glass. In this arrangement, the optical member 4 is made of an inorganic transparent material such as glass so that it is possible to suppress deterioration in the optical member 4 due to light. In particular, in the case of an LED that emits ultraviolet rays, the optical member 4 is more damageable in comparison with the blue light-emitting LED, this arrangement is more effective for suppressing light-deterioration. Therefore a structure in which an LED that emits ultraviolet rays is mounted on a packaging substrate as the light-emitting element 2, and a fluorescent material that emits RGB lights when excited with an ultraviolet-ray is used as the fluorescent material 3, the application of the optical member 4 made of transparent glass makes it possible to improve durability, and consequently to expand the applicable range of the light-emitting device.

EMBODIMENT 8

Figure 14:
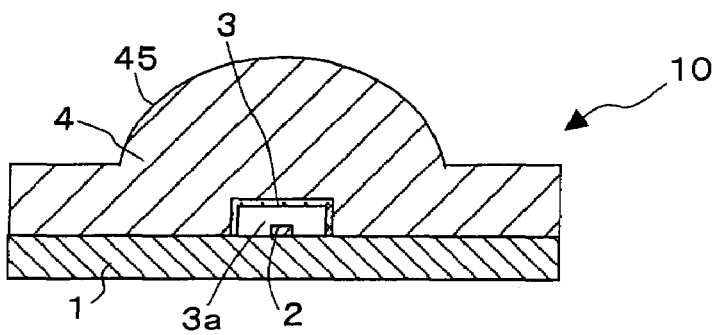
FIG. 14 is a cross-sectional view that shows a light-emitting device in accordance with embodiment 8.
Figure 15:
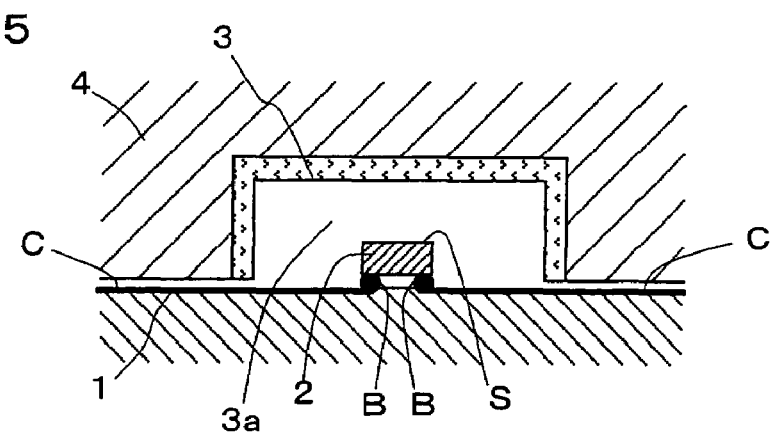
FIG. 15 is an enlarged cross-sectional view that shows an essential portion of FIG. 14.

Referring to FIG. 14 and FIG. 15, the following description discusses embodiment 8 of the present invention. Different from the above-mentioned embodiment, this light-emitting device 10 has no concave section in the packaging substrate 1, and has an arrangement in which the light-emitting element 2 is mounted on a surface of a flat packaging substrate 1 with its face down, by using bumps B and B. Moreover, with respect to a concave section 3a in the optical member 4, a fluorescent member 3 is applied onto the inner surface of the concave section 3a uniformly through coating or the like, without filling all the concave section, with a space for loading the light-emitting element 2 being left therein, in a manner different from the above-mentioned arrangement. With this arrangement, the fluorescent member 3, which substantially surrounds the light-emitting element 2, is allowed to completely capture light from the light-emitting element 2 so that it becomes possible to reduce losses due to light leakage, and consequently to provide high efficiency.

EMBODIMENT 9

Figure 16:
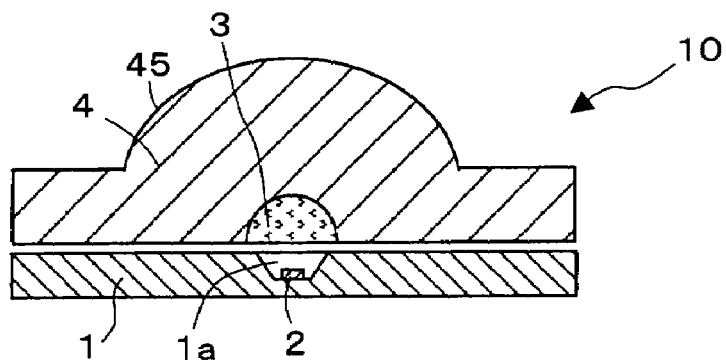
FIG. 16 is a cross-sectional view that shows a light-emitting device in accordance with embodiment 9.
Figure 17:
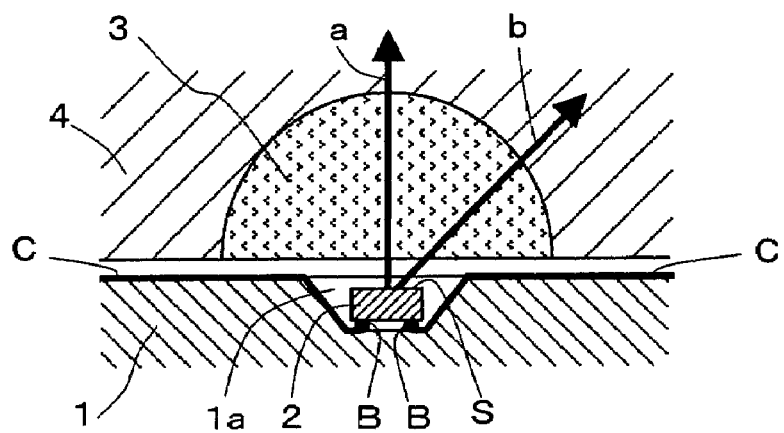
FIG. 17 is an enlarged cross-sectional view that shows an essential portion of FIG. 16.

Referring to FIG. 16 and FIG. 17, the following description discusses embodiment 9 of the invention. In this light-emitting device 10, the external shape of the fluorescent member 3 has a semi-spherical shape with the light-emitting element 2 being positioned substantially in the center. Consequently, the transmission paths of light rays a and b from the light-emitting element 2 in the fluorescent member 3 have substantially the same light path length. With this arrangement, the rates at which the light rays a and b, emitted from the light-emitting element 2, cause light excitation in the fluorescent material when passing through the fluorescent member 3 are made substantially the same for any light rays from the light emitting element 2, whichever directions they are emitted. For this reason, the color characteristics of the light rays emitted from the light-emitting device are made substantially uniform independent of light-emitting angles; therefore, it is possible to reduce color irregularities in light emitted from the light-emitting device and the subsequent color irregularities on a light irradiation surface to which the light is applied.

EMBODIMENT 10

Figure 18:
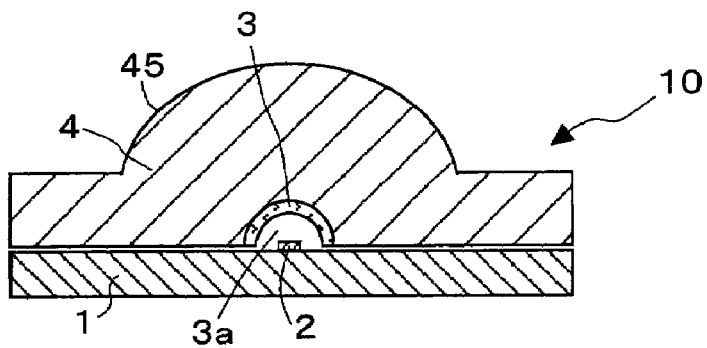
FIG. 18 is a cross-sectional view that shows a light-emitting device in accordance with embodiment 10.
Figure 19:
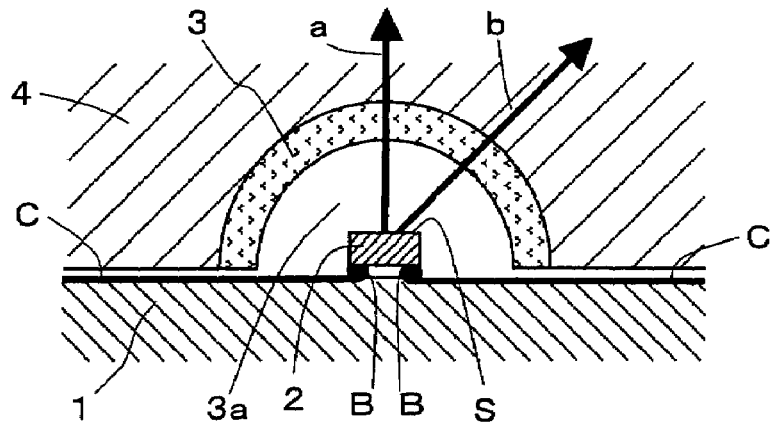
FIG. 19 is an enlarged cross-sectional view that shows an essential portion of FIG. 18.
Figure 20:
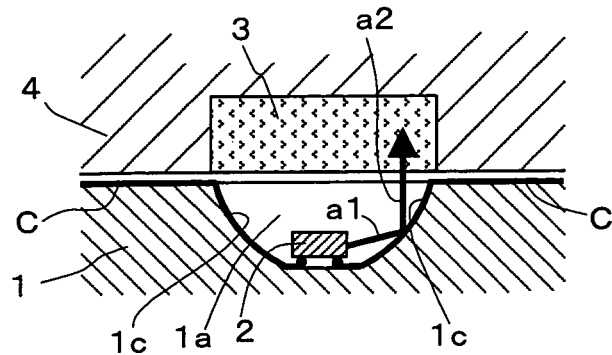
FIG. 20 is a cross-sectional view that shows a light-emitting device in accordance with embodiment 11.
Figure 21:
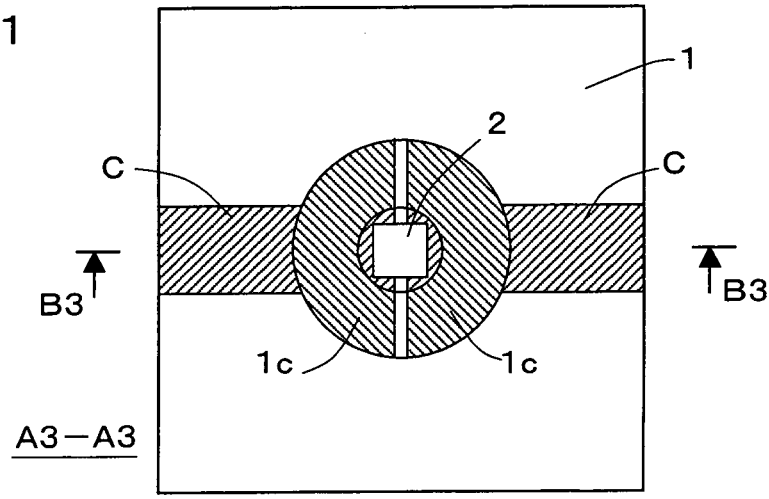
FIG. 21 is a plan view that shows a light-emitting device in accordance with embodiment 11, and corresponds to a drawing taken along line A3—A3 in FIG. 22.
Figure 22:
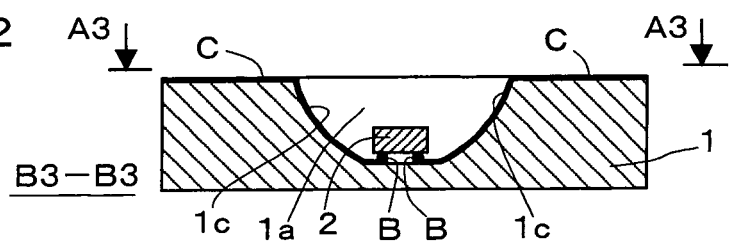
FIG. 22 is a cross-sectional view taken along line B3—B3 in FIG. 21.

Referring to FIG. 18 and FIG. 19, the following description discusses embodiment 9 of the present invention. The light-emitting device 10 of the present embodiment, which relates to the above-mentioned embodiment 8 shown in FIG. 14 and FIG. 15, has an arrangement in which the fluorescent member 3 is formed into a spherical shell shape with the light-emitting element 2 being located substantially in the center. Since the shape of the fluorescent member 3 is designed to include the light-emitting element 2 in the center portion thereof, and since the light-incident-side surface shape and the light-release-side surface shape of the fluorescent member 3 form curved surfaces derived from a coaxial globe, the light-path lengths from the light-emitting element are made substantially the same. With this arrangement, the rates at which light rays, emitted from the light-emitting element, cause light excitation in the fluorescent material when passing through the fluorescent member are made close to the same value for any light rays from the light-emitting element whichever directions they are emitted; thus, it is possible to reduce color irregularities in light emitted from the light-emitting device and the subsequent color irregularities on a light irradiation surface to which the light is applied. Moreover, since light emitted from the light-emitting element is made incident on a surface having a curved surface shape of the fluorescent member on the light-emitting element side, the reflection on this surface is suppressed with the result that the light utility efficiency is improved.

EMBODIMENT 11

Referring to FIGS. 20 to 23, the following description discusses embodiment 11 of the present invention. In this light-emitting device, the concave section 1a formed in the packaging substrate 1 has a parabolic shape 1c. Further, aluminum is vapor-deposited on the surface of the parabolic shape 1c to form a mirror reflecting surface. Since this aluminum deposition surface is connected to the wiring patterns C and C formed on the flat portion of the packaging substrate 1 to form one portion of wiring patterns, insulation separation is made in the center portion. With this arrangement, light a1 that is not directly made incident on the fluorescent member 3 from the light-emitting element 2 is reflected by the concave inner circumferential surface having the parabolic shape to form substantially parallel light rays a2, and effectively made incident on the fluorescent member 3. Moreover, this arrangement is advantageous in that both of the wiring patterns C, C and the reflecting surface are formed in one process.

EMBODIMENT 12

Figure 23:
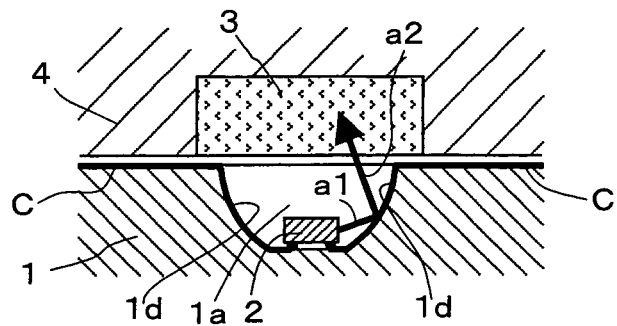
FIG. 23 is a cross-sectional view that shows a light-emitting device in accordance with embodiment 12.

Referring to FIG. 23, the following description discusses embodiment 12 of the present invention. In this light-emitting device, the parabolic shape in the above-mentioned embodiment 11 is formed into an elliptical shape 1c, and a mirror reflecting surface is formed thereon by aluminum vapor deposition in the same manner as described above. With this arrangement, light a1 that is not directly made incident on the fluorescent member 3 from the light-emitting element 2 is reflected by the concave inner circumferential surface having the elliptical shape to be converged in the elliptical focal direction (light a2) so that the quantity of incident light onto the fluorescent member 3 is made greater in the center portion thereof. Therefore, the light emission of the fluorescent member 2 serving as a pseudo-light source for the optical member 4 is allowed to have high luminance in the center portion of the fluorescent member 3, and consequently to form a point light source; thus, it becomes possible to easily align light rays by using the optical member efficiently.

EMBODIMENT 13

Figure 24:
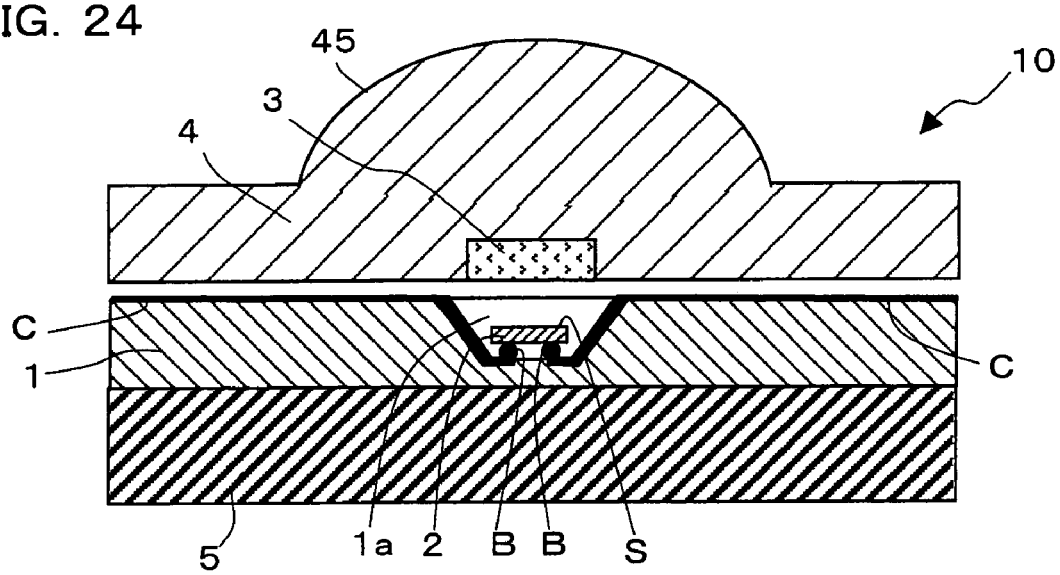
FIG. 24 is a cross-sectional view that shows a light-emitting device in accordance with embodiment 13.

Referring to FIG. 24, the following description discusses embodiment 13 of the present invention. This light-emitting device has a metal substrate 5 of a superior heat radiating property attached on the lower portion of the packaging substrate 1. This arrangement makes it possible to improve the heat radiating property of the light-emitting element 2, and consequently to further lengthen the service life of the light-emitting element 2. Thus, the light-emitting element 2, limited in power input due to temperature control, can efficiently radiate heat so that the power input to the light-emitting element is increased, and it is possible to increase the quantity of light emission. With respect to the structure for improving the heat radiating property, in addition to the structure shown in this figure, in the case of the structure having no concave section in the packaging substrate 1 as shown in embodiment 8 and embodiment 10, a light-emitting element can be mounted on a metal plate through an electrically insulating film interpolated between the metal plate and the wiring patterns for the light-emitting element. In this case, the heat radiating effect of the light-emitting element can be improved by reducing the heat resistance of the electric insulating film.

EMBODIMENT 14

Figure 25:
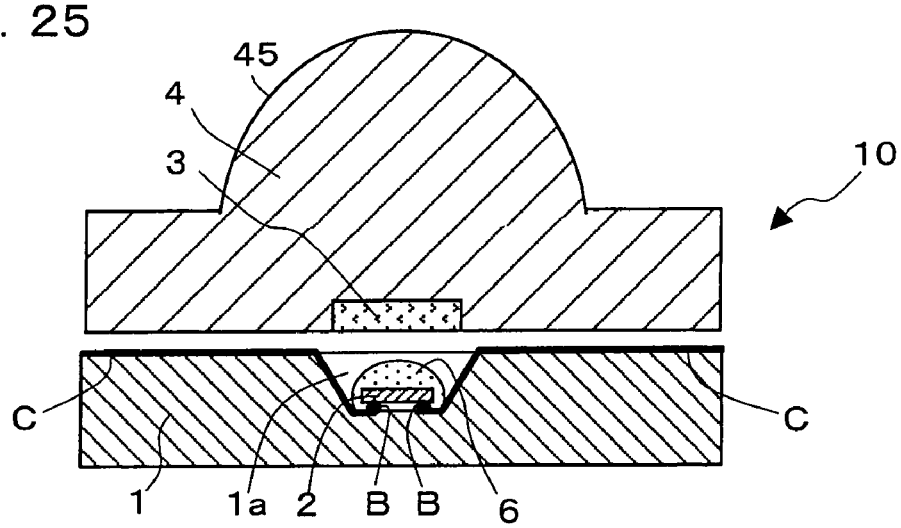
FIG. 25 is a cross-sectional view that shows a light-emitting device in accordance with embodiment 14.

Referring to FIG. 25, the following description discusses embodiment 14 of the present invention. This light-emitting device 10 has a modified structure of the light-emitting device shown in the aforementioned embodiment 1. The periphery of the light-emitting element 2 is sealed with a light-transmitting sealing resin 6 that is formed in a manner so as to form a curved surface. In the present embodiment, a light-transmitting silicone resin is used as the sealing resin 6; however, the sealing resin is not particularly limited to the silicone resin. With this arrangement, since the light-emitting element can be sealed by a light-transmitting resin that has a refractive index that is greater than air and smaller than the light-emitting element, it becomes possible to efficiently extract light from the light-emitting element. Moreover, since the surface of the sealing resin is formed into a curved surface, the light component reflecting at the interface between the sealing resin and the air layer is reduced, thereby making it possible to further increase the light-extracting efficiency, and consequently to increase the efficiency of the light-emitting element.

EMBODIMENT 15

Figure 26:
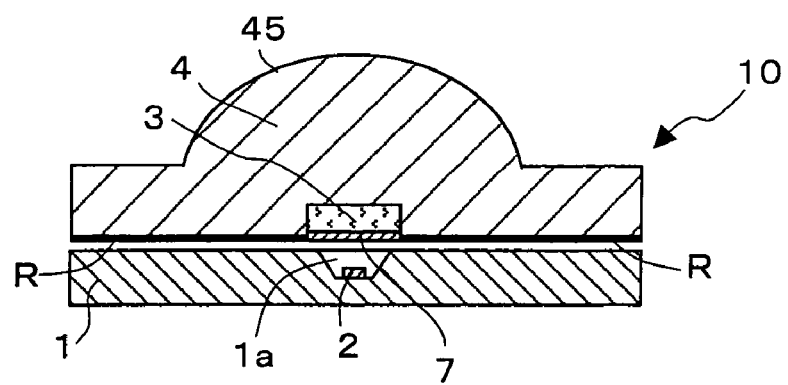
FIG. 26 is a cross-sectional view that shows a light-emitting device in accordance with embodiment 15.
Figure 27:
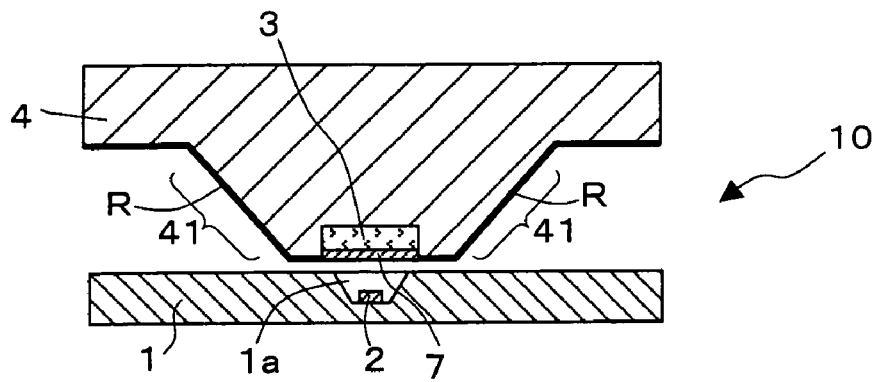
FIG. 27 is a cross-sectional view that shows a light-emitting device in accordance with embodiment 15.

Referring to FIG. 26 and FIG. 27, the following description discusses embodiment 15 of the present invention. A light-emitting device 10 of the present embodiment has a modified structure of the structure shown in FIG. 1 and FIG. 8 in which a reflection preventive film 7 is formed on the side facing the light-emitting element 2 of the fluorescent member 3. The reflection preventive film 7 is an optical multi-layer of 10 layers made of a combination of $SiO_2$ films/$TiO_2$ films that have respectively controlled film thickness so as to minimize the reflection on the incident surface of the fluorescent member 3 with respect to the wavelength of light emitted by the light-emitting element 2. Here, the kinds of the reflection preventive film material are not limited by those of the present embodiment. Moreover, a light reflecting film R is formed at a portion of a surface of the optical member 4 that faces the packaging substrate 1 and does not have the reflection preventive film 7 formed thereon. However, the kind of the light reflecting film R is not limited by that of the present embodiment.

With this arrangement, among light rays that proceed from the light-emitting element 2 toward the fluorescent member 3, those light rays that would be reflected by the surface of the fluorescent member 3 in the case of no reflection preventive film 7 are made incident on the fluorescent member 3. Thus, it becomes possible to improve the light utility efficiency of the light-emitting device 10. Moreover, since the light reflecting film R makes it possible to prevent leakage of light from the optical member 4, this function also increase the light utility efficiency thereof.

EMBODIMENT 16

Figure 28:
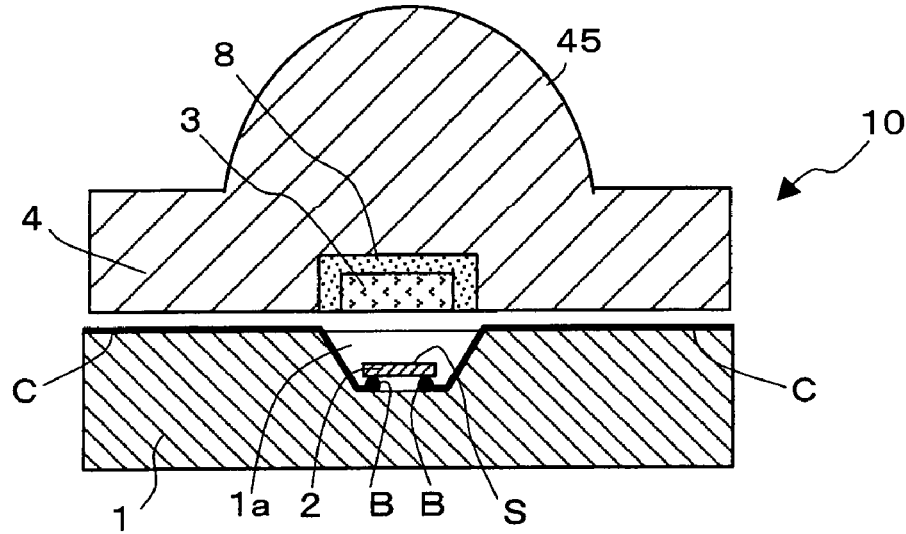
FIG. 28 is a cross-sectional view that shows a light-emitting device in accordance with embodiment 16.
Figure 29:
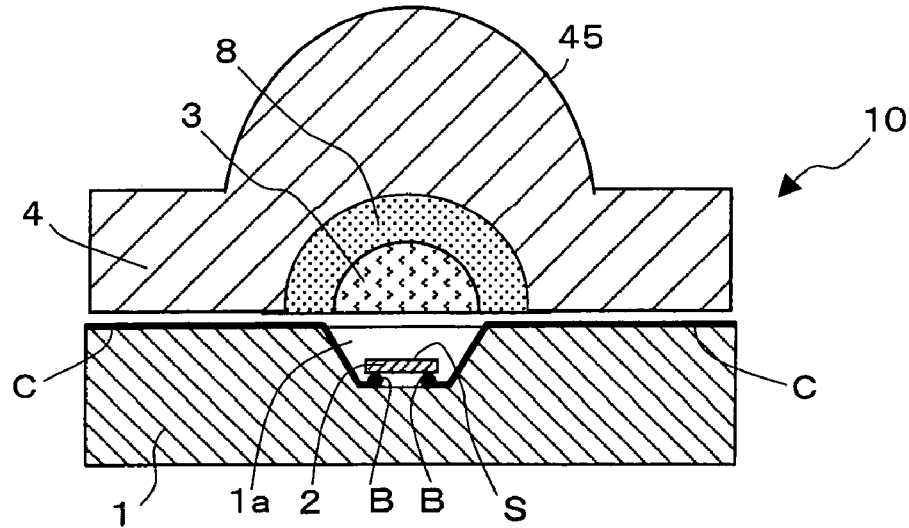
FIG. 29 is a cross-sectional view that shows a light-emitting device in accordance with embodiment 16.

Referring to FIG. 28 and FIG. 29, the following description discusses embodiment 16 of the present invention. The light-emitting device 10 of the present embodiment has substantially the same structure as that of FIG. 1, and a light-scattering member 8 is formed on the side of the fluorescent member 3 facing the optical member 4 in a manner so as to surround the fluorescent member 3. With respect to the material of the light-scattering member 8, $SiO_2$ fine particles having a size of 1 to 2 μm are used. However, the kind of the light-scattering member 8 is not limited by the present embodiment. Moreover, the shape of the light-scattering member 8 is not limited by the present embodiment, either. As shown in FIG. 29, in the case when both of the fluorescent member 3 and the light-scattering member 8 are formed into a semi-spherical shape, light rays applied from the fluorescent member 3 to the optical member 4, have an equal light path length in the light-scattering member 8 on average so that it is possible to reduce color irregularities on the light-emitting surface in relation to the observing direction. Moreover, with this arrangement, light released from the fluorescent member 3 is scattered by the light-scattering member 8 so that the distribution of light intensity is averaged. For this reason, color characteristics of light emitted from the light-emitting device 10 are alleviated so as not to be dependent on the radiation angle of light; thus, it is possible to prevent color irregularities of light emitted from the light-emitting device and resulting color irregularities on the surface irradiated with this light.

EMBODIMENT 17

Figure 30:
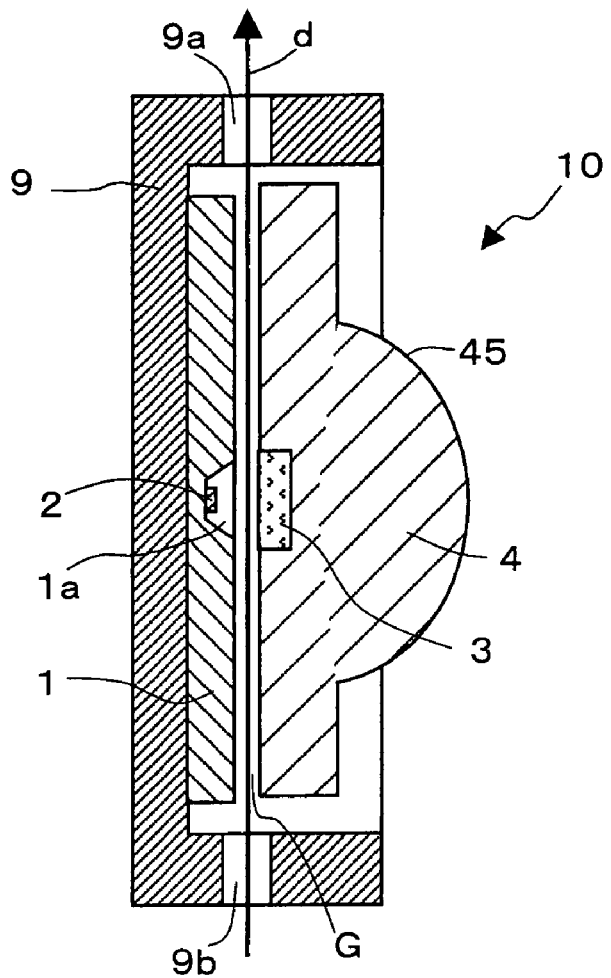
FIG. 30 is a cross-sectional view that shows a light-emitting device in accordance with embodiment 17.
Figure 31:
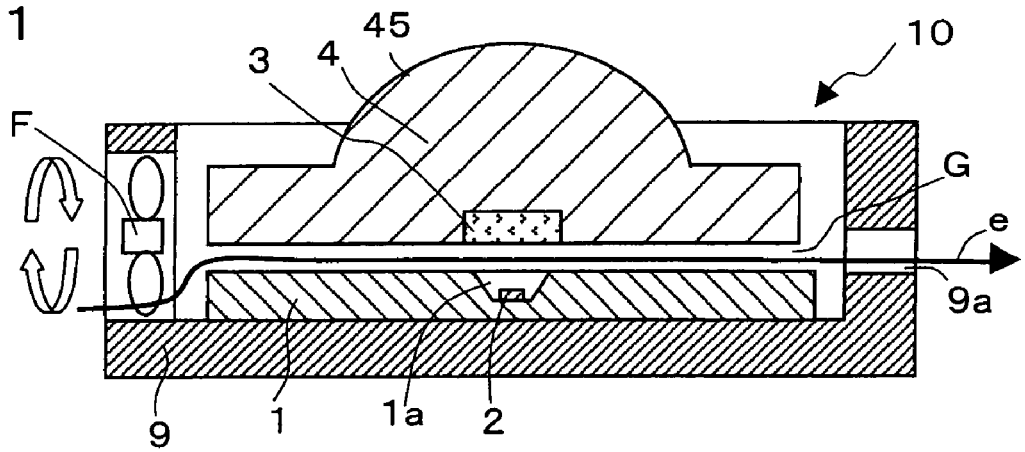
FIG. 31 is a cross-sectional view that shows a light-emitting device in accordance with embodiment 17.
Figure 32:
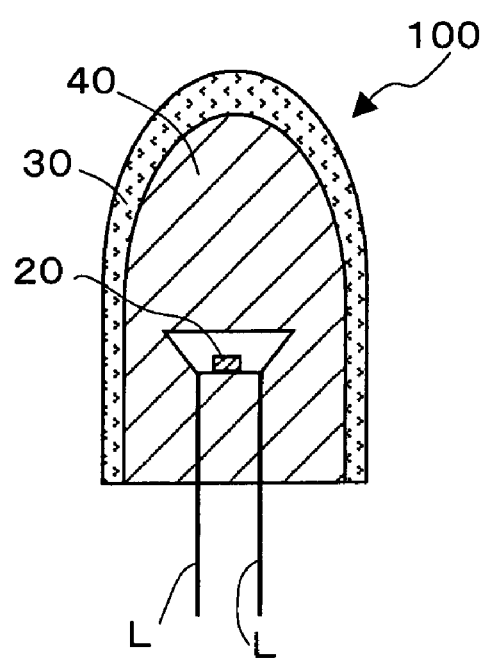
FIG. 32 is a cross-sectional view that shows a conventional light-emitting device.
Figure 33:
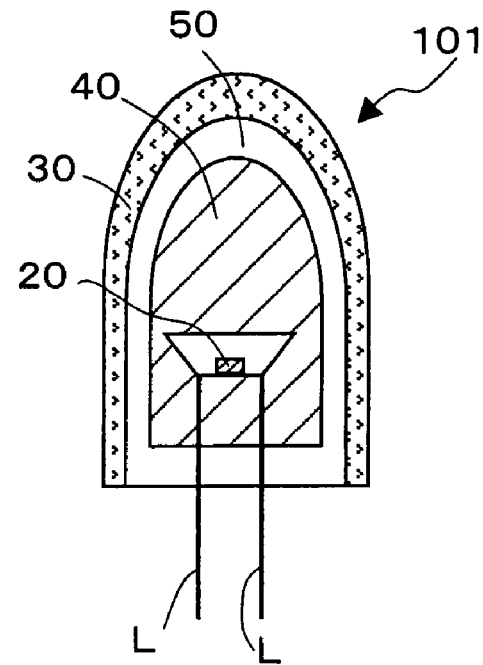
FIG. 33 is a cross-sectional view that shows a conventional light-emitting device.

Referring to FIG. 30 and FIG. 31, the following description discusses embodiment 17 of the present invention. In the light-emitting device 10 shown in these figures, heat radiation is achieved by using a gas flow that passes through a gap placed between the packaging substrate 1 containing the light-emitting element 2 and the optical member 4 including the fluorescent member 3. In the light-emitting device 10 shown in FIG. 30, the light-emitting device having substantially the same structure as the light-emitting device of embodiment 1 is prepared as a longitudinal device surrounded by a box-shaped member 9 made of aluminum. Air holes 9a and 9b are formed in upper and lower portions of the box-shaped member 9, and these air holes 9a and 9b are allowed to communicate with the gap G formed in the light-emitting device 10. With this arrangement, an ascending air flow is generated naturally in the air holes and the gap that communicate with each other during operations of the light-emitting device 10 so that heat radiation of the light-emitting element 2 is accelerated. Therefore, the heat radiation of the light-emitting element 2 is accelerated, thereby making it possible to length the service life.

Moreover, in a light-emitting device 10 shown in FIG. 31, an air-blowing-use or air-ventilating-use fan F is installed on the air hole 9b side that is located on one side of the device shown in FIG. 30. With this arrangement, since a forced air flow is formed by the fan F, the heat radiation of the light-emitting device 2 is accelerated so that it is possible to lengthen the service life thereof. Moreover, different from the aforementioned device, since the fan F is prepared, it is possible to maintain the heat radiating property even in the case when the light-emitting device 10 is laterally placed.

The present application claims the priority based upon the patent application filed on Jul. 26, in 2001. The entire contents of the application are incorporated into the present application by reference thereto.

INDUTRIAL APPLICABILITY

The present invention is widely applicable to industrial fields in which light generated through electric energy is utilized as a light source for mixed color light. Further, since the service life of light-emitting device is lengthened by lengthening the service life of the fluorescent member, the present invention makes it possible to widen the possibility of application of the device as light sources that are used in the fields requiring long-term reliability, and installed at locations having difficulty in exchanging, repairing and the like of the device. For example, the device of the present invention is applicable to illumination-use light sources, indicator-display-use light sources for various switches, light sources for traffic signals, light sources for various warning displays in automobiles, light sources for advertising and commercial-use displays, and the like.

The invention claimed is:

1. A light-emitting device which uses an LED, comprising:
   a packaging substrate;
   a light-emitting element that is placed on the packaging substrate, and has a light-extracting surface from which light is taken out;
   a fluorescent member which is formed by dispersing a fluorescent material in a transparent substance, where the fluorescent material absorbs light from the light-emitting element, and emits light having a wavelength different from that of the absorbed light, and is placed face to face with the light-extracting surface of the light-emitting element with a clearance gap interpolated in between ; and
   an optical member which receives incident light from the light-emitting element which has been made incident thereon through the fluorescent member, and aligns the incident light toward the outside of the device.

2. The light-emitting device according to claim 1, wherein the light-emitting element is mounted on the packaging substrate with a face thereof down.

3. The light-emitting device according to claim 1, wherein the optical member has a convex-lens shape.

4. The light-emitting device according to claim 1, wherein: a portion of the optical member that faces the packaging substrate forms a slope surface having a predetermined angle with respect to the light-extracting surface of the light-emitting element, and light rays that have been emitted by the light emitting element and have passed through the fluorescent member and those light rays among light rays that have been emitted by the light-emitting element that are absorbed by the fluorescent member and re-emitted as light having a different wave length, with both types of light rays being made incident of the slope surface, are reflected in the substantially normal direction to the light-extracting surface of the light-emitting element.

5. The light-emitting device according to claim 1, wherein a surface of the optical member on the light-emitting element side is made into a light reflecting unit having an opening section through which light from the light-emitting element is took in.

6. The light-emitting device according to claim 1, wherein: the optical member is made of a first optical member having a low refractive index and a second optical member having a high refractive index, and light rays that have been emitting from the light-emitting element and have passed through the fluorescent material and those light rays among light rays that have been emitted from the light-emitting element that are absorbed by the fluorescent member and re-emitted as light having a different wavelength are made incident on the second optical member through the first optical member.

7. The light-emitting device according to claim 1, wherein the optical member is made from an inorganic transparent material.

8. The light-emitting device according to claim 1, wherein the light-emitting element is substantially surrounded by the fluorescent member.

9. The light-emitting device according to claim 1, wherein the fluorescent member is formed in such a manner that light transmission paths from the light-emitting element in the fluorescent member have substantially the same light path length.

10. The light-emitting device according to claim 9, wherein the fluorescent member has a light emitting surface that is formed into a curved surface.

11. The light-emitting device according to claim 10, wherein the fluorescent member has a surface facing the light-emitting element, which is formed into a curved surface.

12. The light-emitting device according to claim 1, wherein: the packaging substrate has a concave section, with the light-emitting element being placed on a bottom of the concave section, and a surface of the fluorescent member that faces the light-emitting element is formed to have substantially the same size as an opening shape of the concave section.

13. The light-emitting device according to claim 12, wherein the concave section has an inner circumferential surface that has a parabolic surface which reflects light directed thereto from the light-emitting element toward the fluorescent member.

14. The light-emitting device according to claim 12, wherein the concave section has an inner circumferential surface that has an elliptical surface which reflects light directed thereto from the light-emitting element toward the fluorescent member.

15. The light-emitting device according to claim 12, wherein the fluorescent member is fitted to the opening section of the concave section.

16. The light-emitting device according to claim 1, wherein the packaging substrate is made from a heat conductive material.

17. The light-emitting device according to claim 1, wherein the light-emitting element is sealed by a light-transmitting resin, with a light-emitting surface of the transparent resin formed into a curved surface.

18. The light-emitting device according to claim 1, wherein a reflection preventive film, which suppresses light reflection on the fluorescent member surface with respect to light from the light-emitting element, and increases the quantity of incident light into the fluorescent member, is interpolated between the fluorescent member and the light-emitting element.

19. The light-emitting device according to claim 1, wherein a light-scattering material, which scatters light rays that have been emitted from the light-emitting element and have passed through the fluorescent member or those light rays among the light rays emitted from the light-emitting element that are absorbed by the fluorescent member and re-emitted as light having a different wavelength, is interpolated between the fluorescent member and the optical member.

20. The light-emitting device according to claim 1, wherein the fluorescent member is placed inside the concave section formed in the optical member.

* * * * *

UNITED STATES PATENT AND TRADEMARK OFFICE
CERTIFICATE OF CORRECTION

PATENT NO. : 7,084,435 B2  Page 1 of 1
APPLICATION NO. : 10/483995
DATED : August 1, 2006
INVENTOR(S) : M. Sugimoto et al.

It is certified that error appears in the above-identified patent and that said Letters Patent is hereby corrected as shown below:

On the Title Page at Item (22), PCT Filed, "Jan. 6, 2003" should be --July 26, 2002--.

Signed and Sealed this

Twentieth Day of March, 2007

JON W. DUDAS
*Director of the United States Patent and Trademark Office*